(12) United States Patent
Shahi et al.

(10) Patent No.: US 10,680,500 B2
(45) Date of Patent: Jun. 9, 2020

(54) SYSTEM AND METHOD FOR WIRELESSLY MANAGING ELECTRIC MOTORS

(71) Applicant: Nidec Motor Corporation, St. Louis, MO (US)

(72) Inventors: Prakash B. Shahi, St. Louis, MO (US); Christopher D. Schock, O'Fallon, MO (US); Randy L. Bomkamp, Creve Coeur, MO (US); Anandan C. Velayutham, St. Louis, MO (US)

(73) Assignee: Nidec Motor Corporation, St. Louis, MO (US)

( * ) Notice: Subject to any disclaimer, the term of this patent is extended or adjusted under 35 U.S.C. 154(b) by 0 days.

(21) Appl. No.: 16/034,918

(22) Filed: Jul. 13, 2018

(65) Prior Publication Data

US 2019/0020247 A1 Jan. 17, 2019

Related U.S. Application Data

(60) Provisional application No. 62/532,538, filed on Jul. 14, 2017.

(51) Int. Cl.
*H02K 11/27* (2016.01)
*H02K 15/00* (2006.01)
(Continued)

(52) U.S. Cl.
CPC ......... *H02K 15/0006* (2013.01); *G06F 30/17* (2020.01); *H02K 11/27* (2016.01);
(Continued)

(58) Field of Classification Search
CPC ............................ H02P 31/00; G05B 19/0426
See application file for complete search history.

(56) References Cited

U.S. PATENT DOCUMENTS 8,288,976 B2 * 10/2012 Jeung ...................... H02P 31/00
318/400.01
8,504,646 B2 * 8/2013 Jeung ...................... H02P 31/00
340/438
(Continued)

OTHER PUBLICATIONS

PCT International Search Report and Written Opinion from PCT Application No. PCT/US18/042094 entitled System and Method for Wirelessly Managing Electric Motors (dated Nov. 29, 2018).

*Primary Examiner* — Rina I Duda
(74) *Attorney, Agent, or Firm* — Hovey Williams LLP

(57) ABSTRACT

A system and method for wirelessly communicating with an HVAC motor or other motor in order to manage the motor with regard to, e.g., identifying a suitable replacement for, programming, monitoring and/or diagnosing, and/or tuning or otherwise reprogramming the motor without physically connecting to the motor. A technician uses a software application on a smartphone, tablet, or other portable device to communicate with the motor controller via a wireless communication device incorporated into the motor assembly. The smartphone may receive relevant information, such as identification, programming, or diagnostic information, and process the information or wirelessly transmit the information to a server for processing. Based on the information, the smartphone may transmit programming instructions to the motor controller via the wireless communication device. Further, the wireless communication device may transmit sensor data associated with the motor to allow for monitoring the motor's performance.

20 Claims, 7 Drawing Sheets

(51) Int. Cl.
  *H02K 11/35* (2016.01)
  *H02K 11/33* (2016.01)
  *G06F 30/17* (2020.01)
  *H02K 11/26* (2016.01)
  *H02K 11/25* (2016.01)

(52) U.S. Cl.
  CPC ............ *H02K 11/33* (2016.01); *H02K 11/35* (2016.01); *H02K 11/25* (2016.01); *H02K 11/26* (2016.01)

(56) References Cited

U.S. PATENT DOCUMENTS

| | | |
|---|---|---|
| 9,491,242 B2 | 11/2016 | Bomkamp |
| 9,794,347 B2 | 10/2017 | Bomkamp |
| 9,899,949 B2 | 2/2018 | Shahi |
| 2007/0118345 A1 | 5/2007 | Olesen et al. |
| 2009/0315496 A1 | 12/2009 | Jeung et al. |
| 2013/0227258 A1* | 8/2013 | Rumani ............ G05B 19/0426 713/1 |
| 2014/0077972 A1* | 3/2014 | Rathi ............... G07C 5/008 340/902 |
| 2014/0079564 A1 | 3/2014 | Becerra et al. |
| 2014/0139166 A1* | 5/2014 | Durfee ............. G06F 8/60 318/494 |
| 2015/0084571 A1* | 3/2015 | Durfee ............. G06F 8/60 318/494 |
| 2015/0296050 A1* | 10/2015 | Bomkamp ............ H04L 67/12 709/217 |
| 2016/0028559 A1 | 1/2016 | Bernard et al. |

\* cited by examiner

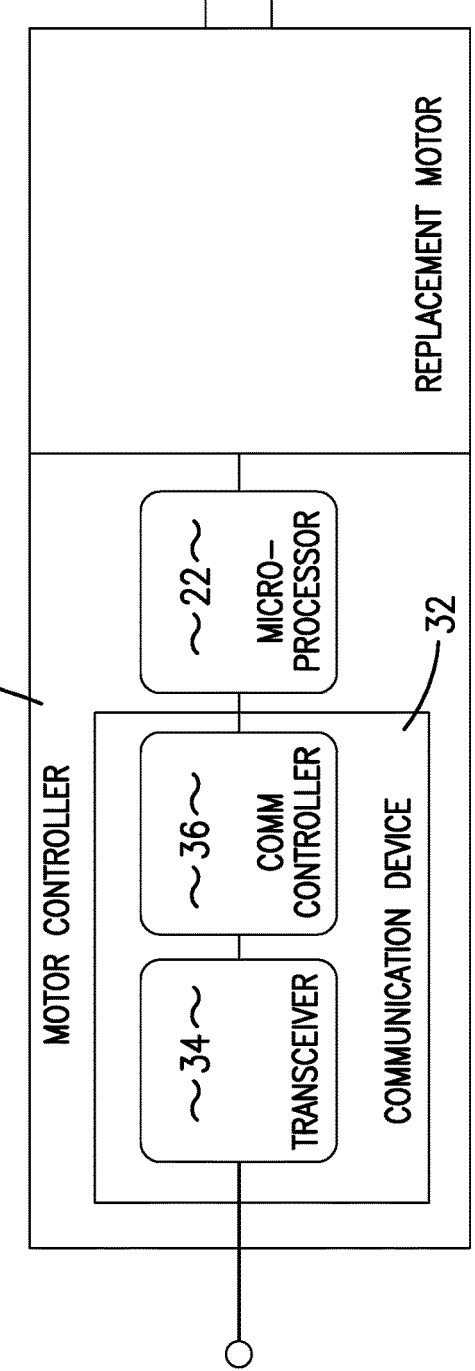
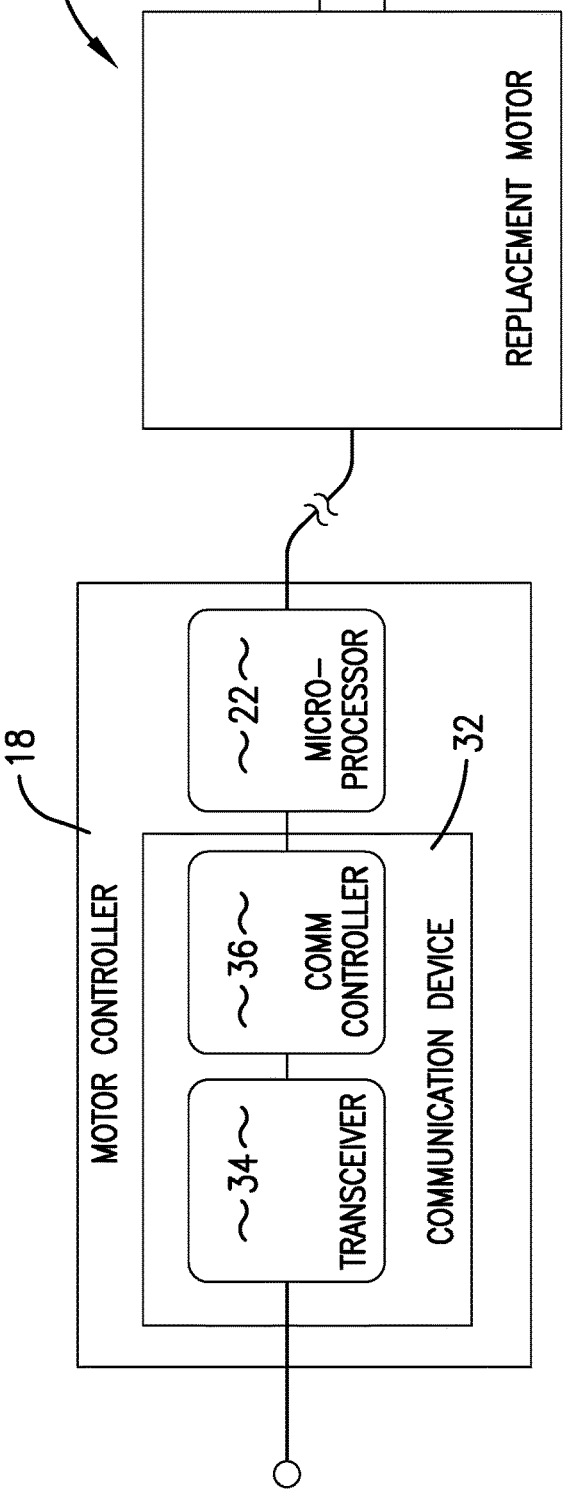

TABLE 1

| TAP LEVELS ARE EXPRESSED IN PERCENTAGES OF MOTOR'S FULL RATED TORQUE | | | | | |
|---|---|---|---|---|---|
| FACTORY PROGRAMMED LEVELS | | BAND TUNING OF NEW TAP LEVELS ALL TAPS INCREASE OR DECREASE BY THE SAME PERCENTAGE | | | |
| TAP | EXISTING TAP LEVEL | NEW -5% | +5% | -10% | +10% |
| 1 | 30 | 28.5 | 31.5 | 27 | 33 |
| 2 | 60 | 57 | 63 | 54 | 66 |
| 3 | 70 | 66.5 | 73.5 | 63 | 77 |
| 4 | 80 | 76 | 84 | 72 | 88 |
| 5 | 90 | 85.5 | 94.5 | 81 | 99 |

Fig. 7.

SYSTEM AND METHOD FOR WIRELESSLY MANAGING ELECTRIC MOTORS

RELATED APPLICATION

The present U.S. non-provisional patent application is related to and claims priority benefit of a prior-filed U.S. provisional patent application titled "Systems and Methods for Wirelessly Selecting and Programming a Motor," Ser. No. 62/532,538, filed Jul. 14, 2017. The entire content of the identified prior-filed patent application is hereby incorporated by reference into the present patent application as if fully set forth herein.

FIELD

The present invention relates to systems and methods for managing electric motors, and more particularly, embodiments concern a system and method for wirelessly communicating with an electric motor in order to identify a suitable replacement for, program, monitor and/or diagnose, and/or tune or otherwise reprogram the motor without physically connecting to the motor.

BACKGROUND

Electric motors, such as are used in heating, ventilation, and air conditioning (HVAC) systems, fluid circulation systems, and other systems, often must be programmed to operate according to the specific needs of these systems. The motors are programmed using a specialized motor programming computer at a motor manufacturing facility, at the point of sale, or at an assembly plant. Programming a motor that is already onsite requires a technician to return the motor to the motor manufacturing facility or to another designated programming site that has the necessary specialized motor programming computer. Similarly, motors at inventory sites that do not have a specialized motor programming computer must be sent back to the motor manufacturing facility to be programmed for their selected applications.

After they leave the manufacturing facility, motors occasionally have to be reprogrammed or tuned, diagnosed, or replaced with new motors when they malfunction or otherwise no longer work properly or optimally. A technician performing such work is required to have or obtain and carry a programming tool, including a connector, suitable for physically connecting to and interfacing with the specific motor or the specific type of motor at issue. For example, a technician arriving on-site with a replacement motor can either extract the programmed parameters from the existing motor or download the correct information, if available, from a database using wireless communication. However, both options require the technician to have or obtain and carry the proper programming tool, including a connector for physically connecting to the existing and/or replacement motors to accomplish the task. Different motors, different types of motors, or different brands of motors may require different programming tools, particularly different physical connectors, and having or obtaining and carrying the several different physical connectors that may be needed increases the cost and time required to perform the work. Further, motors, especially motors that are incorporated into larger systems, may be difficult to access in order to make the required physical connections, and dismantling the larger systems in order to gain such access can further increase the cost and time needed to perform the work.

SUMMARY

Embodiments of the present invention solve the above-described and other problems by providing a system and method for wirelessly communicating with an HVAC or other electric motor in order to identify a suitable replacement for, program, monitor and/or diagnose, and/or tune or otherwise reprogram the motor without physically connecting to the motor.

In a first embodiment, a system is provided for selecting and programming a replacement motor for an existing motor. Broadly, the system may include a server computer and a portable electronic communications device including a software application. The server computer may include a non-transitory computer readable medium storing selection information for selecting the replacement motor and programming information for programming the replacement motor, and a connection to a wireless communication network. The portable electronic communications device may be configured to wirelessly communicate with the existing and replacement motor controllers via a first wireless transceiver associated with the existing motor controller and a second wireless transceiver associated with the replacement motor controller, and to wirelessly communicate with the server computer via the connection to the wireless communication network. The software application may be configured to wirelessly receive identification information for the existing motor from the existing motor controller, and to wirelessly transmit the identification information to the server computer, wherein the server computer determines a recommendation for the replacement motor and the programming information for the replacement motor based on the identification information. The software application may be further configured to wirelessly receive the recommendation for the replacement motor and the programming information for the replacement motor, and to wirelessly transmit the programming information to the replacement motor controller of the replacement motor.

Various implementations of the first embodiment may include any one or more of the following features. The portable electronic communications device may be a smartphone. The portable communications device may be configured to communicate with the first and second wireless transceivers via Bluetooth, and the wireless communication network over which the portable electronic communications device communicates with the server computer may be the Internet. The identification information may include at least one of a model number, a horsepower rating, an input voltage, and a manufacturer name for the existing motor. The portable electronic communications device may visually display the identification information. The recommendation for the replacement motor may be in the form of at least one of a model number, a brand name, and a motor operating parameter. The server computer may further wirelessly transmit installation instructions for installing the replacement motor to the portable electronic communications device, and the portable electronic communications device may wirelessly receive and visually display the installation instructions.

In a second embodiment, a system is provided for managing a performance of a motor. Broadly, the system may include a server component and a portable electronic communications device including a software application. The server computer may include a non-transitory computer readable medium storing diagnostic information for diagnosing a performance problem of the motor, and recommendation information for recommending an action for addressing the performance problem of the motor, and a connection to a wireless communication network. The portable electronic communications device may be configured to wirelessly communicate with the motor controller via a wireless transceiver associated with the moto controller, and to wirelessly communicate with the server computer via the connection to the wireless communication network. The software application may be configured to wirelessly receive identification information for the motor from the motor controller, and to wirelessly receive operating information for the motor from the motor controller. The software application may be further configured to wirelessly transmit the identification and operating information to the server computer, wherein the server computer may determine whether the motor is performing properly based on the identification and operating information, and if the motor is not performing properly, the server computer may identify a motor issue for the motor based on the diagnostic information and determine a recommendation for a particular action for addressing the motor issue based on the recommendation information. The software application may be further configured to wirelessly receive and visually display the recommendation for the particular action for addressing the performance problem.

Various implementations of the second embodiment may include any one or more of the following features. The portable electronic communications device may be a smartphone. The software application may be further configured to visually display the identification and operating information. The operating information may include a diagnostic indicator of a performance problem, and/or may include an operating history for the motor which may include a number of operating hours, one or more peak voltages, and one or more operating temperatures. The particular action for addressing the performance problem may be to replace the motor. The system may further include one or more sensors monitoring a motor condition of the motor, and the software application may be further configured to wirelessly receive sensor data from the one or more sensors regarding the condition of the motor, and to wirelessly transmit the sensor data to the server computer along with the identification and operating information.

In a third embodiment, a system is provided for tuning a motor to a larger system in which the motor is incorporated. Broadly, the system may include a server computer and a portable electronic device including a software application. The server computer may include a non-transitory computer readable medium storing evaluation information for evaluating a performance of the larger system, and recommendation information for recommending an action for tuning the motor to the larger system based on the performance of the larger system, and a connection to a wireless communication network. The portable electronic communications device configured to wirelessly communicate with the motor controller via a wireless transceiver associated with the motor controller, and to wirelessly communicate with the server computer via the connection to the wireless communication network. The software application may be configured to wirelessly receive an identification information, a programming information, and an operating information for the motor from the motor controller, and to wirelessly transmit the identification, programming information, and operating information to the server computer, wherein the server computer may evaluate the performance of the larger system based on the evaluation information, and if the larger system is not performing at a desired level (i.e., within a preferred range of an operational parameter), the server computer may determine a recommendation for a particular action for improving the performance of the larger system based on the recommendation information. The software application may be further configured to wirelessly receive the recommendation for the particular action, and to wirelessly transmit a change to the programming information to the motor controller of the motor in accordance with the particular action. The software application may repeat the foregoing actions to confirm that the larger system is performing at the desired level.

Various implementations of the third embodiment may include any one of more of the following features. The portable electronic communications device may be a smartphone. The portable electronic communications device may visually display the identification information, the programming information, and the performance information. The change to the programming information may include changing a tap setting. The system may further include one or more sensors monitoring a system condition of the larger system, and the software application may be further configured to wirelessly receive sensor data from the one or more sensors regarding the system condition, and to wirelessly transmit the sensor data to the server computer along with the identification information, the programming information, and the operating information.

This summary is provided to introduce a selection of concepts in a simplified form that are further described below in the detailed description. This summary is not intended to identify key features or essential features of the claimed subject matter, nor is it intended to be used to limit the scope of the claimed subject matter. Other aspects and advantages of the present invention will be apparent from the following detailed description of the embodiments and the accompanying drawing figures.

BRIEF DESCRIPTION OF THE DRAWING FIGURES

Embodiments of the present invention are described in detail below with reference to the attached drawing figures, wherein:

FIG. 2 is a schematic diagram of certain components of a first implementation of the system of FIG. 1, wherein a motor controller housing is attached to a motor housing;

FIG. 3 is a schematic diagram of certain components of a second implementation of the system of FIG. 1, wherein the motor controller housing is detached from the motor housing but connected thereto by one or more electrical wires;

FIG. 7 is a table setting forth Tap settings for a Band Tuning technique which relevant to the method of FIG. 6;

Figure 1:
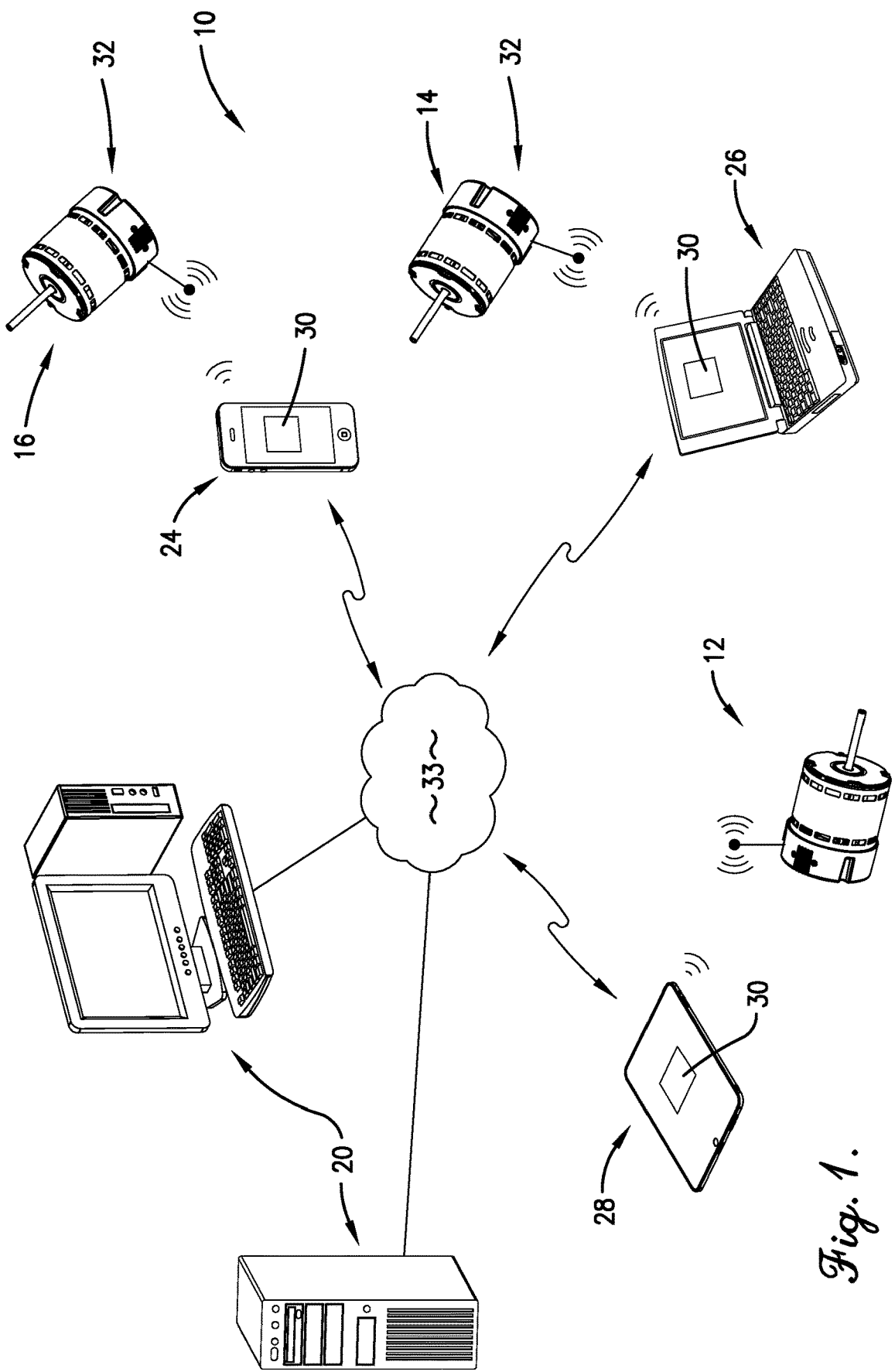
FIG. 1 is a schematic diagram of an embodiment of a motor management system which may be used to wirelessly identify a suitable replacement for, program, monitor and/or diagnose, and/or tune or otherwise reprogram the motor without physically connecting to the motor.

The drawing figures do not limit the present invention to the specific embodiments disclosed and described herein. The drawings are not necessarily to scale, emphasis instead being placed upon clearly illustrating the principles of the invention.

DETAILED DESCRIPTION OF THE EMBODIMENTS

The following detailed description of the invention references the accompanying drawings that illustrate specific embodiments in which the invention can be practiced. The embodiments are intended to describe aspects of the invention in sufficient detail to enable those skilled in the art to practice the invention. Other embodiments can be utilized and changes can be made without departing from the scope of the present invention. The following detailed description is, therefore, not to be taken in a limiting sense.

In this description, references to "one embodiment," "an embodiment," or "embodiments" mean that the feature or features being referred to are included in at least one embodiment of the technology. Separate references to "one embodiment," "an embodiment," or "embodiments" in this description do not necessarily refer to the same embodiment and are also not mutually exclusive unless so stated and/or except as will be readily apparent to those skilled in the art from the description. For example, a feature, structure, act, etc. described in one embodiment may also be included in other embodiments, but is not necessarily included. Thus, the present technology can include a variety of combinations and/or integrations of the embodiments described herein.

Embodiments of the present invention provide a system and method for wirelessly communicating with an HVAC or other electric motor in order to identify a suitable replacement for, program, monitor and/or diagnose, and/or tune or otherwise reprogram the motor without physically connecting to the motor. More specifically, wireless communication devices (i.e., transceivers) and programming software are incorporated into the motor assemblies and are accessible by technicians using portable computing and/or mobile communication devices, thereby reducing or eliminating the need for technicians to have and carry programming tools, reducing or eliminating the need to physically access the motors, and reducing or eliminating the need for the motors to include interface boxes for physically connecting with connectors for wiredly communicating signals. Further, the incorporated wireless communication devices facilitate interfacing with motor sensors (e.g., wireless Bluetooth temperature, humidity, pressure, and/or air sensors) whenever desired, and providing the information from such sensors to internal or external monitoring and/or control systems. Still further, the motors themselves may be used as sensors for sensing the performance of the larger systems of which the motors are a part. Embodiments may be used with motors designed for HVAC systems, refrigeration systems, washing machines, dishwashers, or any other electrically-powered devices or systems.

In one exemplary application of the present technology, a technician may replace an original or otherwise existing motor that can no longer be viably serviced. The technician may carry in their service vehicle a small number of replacement motors from which they may select the replacement motor that best or most effectively emulates the existing motor. To select the correct replacement motor, the technician may use a portable electronic communication device (e.g., a smartphone) to wirelessly retrieve motor information from the existing motor and wirelessly access operating parameters and motor data stored on a server over a wireless communication network. The server may identify a recommended replacement motor and transmit the recommendation to the technician's portable electronic communication device. The technician may use the motor recommendation to select the replacement motor from the replacement motors on hand and replace the existing motor with the replacement motor. The technician may establish a wireless connection between the portable electronic communication device and a wireless communication device incorporated into, onto, adjacent to, or otherwise similarly associated with the replacement motor to wirelessly program the replacement motor to sufficiently emulate the performance of the existing motor.

The present invention may be used with substantially any suitable type of electric motors. The motors may operate on direct current (DC) or alternating current (AC), may be synchronous or asynchronous, and may be single phase or three phase. The motors may be of any type, including but not limited to, permanent split capacitor (PSC) motors, brushed DC motors, switched reluctance motors, coreless or ironless DC motors, series wound universal motors, induction motors, torque motors, or stepper motors. Moreover, the motors may be fixed speed, multi-speed, or variable speed and may have any horsepower (HP) rating.

The motors may have integral or separate motor controllers that provide power to and control operation of one or more of the motors. Each such motor controller may include any combination of circuitry, hardware, firmware, and/or software. The motors may be replaceable with replacement motors that may be programmable to sufficiently emulate or improve upon the operating parameters of the motors they are replacing. One replacement motor may be programmable to replace two, five, ten, or more different types of motors. However, the principles of the present invention are not limited to any particular motor type, technology, or size. The replacement motors may have integral or separate motor controllers that provide power to and control operation of one or more of the motors. Again, each such motor controller may include any combination of circuitry, hardware, firmware, and/or software.

Referring to FIG. 1, an embodiment of a motor programming system 10 is shown along with original or otherwise existing, new, and replacement motors 12, 14, 16, but the principles of the invention are applicable to any number and type of motors. Each motor 12, 14, 16 may be provided with its own or a shared motor controller 18 having a microprocessor 22 for controlling operation of the motor. The motor programming system 10 may include one or more servers 20, one or more portable electronic devices 24, 26, 28, one or more wireless communication devices 32 incorporated into, onto, adjacent to, or otherwise similarly associated with the motor controller 18, and a mobile motor servicing software application 30 running on the portable electronic devices 24, 26, 28. The server 20 and portable electronic devices 24, 26, 28 may be operated by any persons or entities. For example, the server 20 may be operated by system administrators, and the portable electronic devices 24, 26, 28 may be operated by motor installers, service technicians, or property owners who replace motors in HVAC systems, washing machines, dishwashers, or any other electrical device or larger system into which the motor may be incorporated.

The components of the motor programming system 10 illustrated and described herein are merely examples of equipment that may be used to implement embodiments of the present invention and may be substituted with other equipment without departing from the scope of the present invention. Some of the illustrated components of the system 10 may also be combined and/or may be operated by the same persons or entities. Similarly, some aspects of the invention performed with the portable electronic devices 24, 26, 28 may be performed with the server 20 and vice versa.

In more detail, the server 20 electronically stores and/or otherwise has electronic access to selection information for selecting replacement motors, programming information for programming motors, diagnostic information for diagnosing performance problems with motors, recommendation information for recommending actions for addressing performance problems with motors, evaluation information for evaluating the performance of larger systems into which motors are incorporated, and recommendation information for recommending actions for tuning motors to their larger systems. Any or all such information may be in any suitable form and format, such look-up or other tables, decision trees, and/or machine learning abilities. The server 20 may also implement one or more computer programs for performing some of the functions described herein and may provide a web-based portal that can be accessed by the portable electronic devices 24, 26, 28 and other computers. Embodiments of the server 20 may include one or more servers running Windows; LAMP (Linux, Apache HTTP server, MySQL, and PHP/Perl/Python); Java; AJAX; NT; Novel Netware; Unix; Mac OS; or any other software system. The server 20 includes or has access to computer memory and other hardware and software for receiving, storing, accessing, and transmitting information via a wireless communication network 33 as described below. The server 20 may also include conventional web hosting operating software, searching algorithms, and an Internet connection, and are assigned URLs and corresponding domain names so that they can be accessed via the Internet in a conventional manner.

The portable computing devices 24, 26, 28 may be any devices used by motor installers, service technicians, or others while managing (e.g., replacing, programming, diagnosing, and/or tuning) the operation of motors in HVAC systems or other electrically-powered devices or systems. The portable electronic devices 24, 26, 28 may be any type of mobile smartphone, handheld device, tablet, laptop computer, or portable gaming system. The portable electronic devices 24, 26, 28 may each include a touch screen display or a visual display with button inputs and further include computing hardware, software, memory, including hardware and software for wirelessly communicating electronic signals. The portable electronic devices 24, 26, 28 may each include or can access an Internet browser and a conventional Internet connection such as a wireless broadband connection, DSL converter, or ISDN converter so that it can receive communication from the server 20 via the communication network 33 described below.

Referring also to FIGS. 2 and 3, the wireless communication device 32 may be incorporated into the existing and/or the replacement motor controller 18, and configured to wirelessly communicate with the portable electronic device 24, 26, 28 and may include a transceiver 34 and a communication controller 36. The housing of the motor controller 18 may be attached to the housing of the motor 12, 14, 16, as shown in FIG. 2, or the housing of the motor controller 18 may be detached from the housing of the motor 12, 14, 16 with the motor controller 18 connected to the motor by one or more electrical wires, as shown in FIG. 3. The transceiver 34 may wirelessly transmit signals to and receive signals from the portable electronic device 24, 26, 28 via substantially any suitable communication technology, such as a Bluetooth, radio frequency, 3G, 4G, 5G, or near field technology connection. The communication controller 36 may direct the wireless signals received from the portable electronic device 24, 26, 28 and the signals sent from the motor controller of the motor 12 and may be or include a microprocessor, a communication bus, a router, or other signal control device. Components of the system 10 that are incorporated into the motor controller 18, such as the wireless communication device 32, and that require power may receive power from the same source and/or subsystem (e.g., the motor controller 18) that provides power to the motor 12.

Unlike prior art systems, neither a physical communication connector nor an interface box is required to communicate with or program the motor 12, 14, 16. Thus, the associated cables, wires, pins, pin receivers, clips, plugs, or other connection points such as a 4-wire, 16-pin, or serial communication connector may be eliminated. In one implementation, the motors 12, 14, 16 may retain the interface box for other purposes or as a back-up, and the wireless communication device 32 may be incorporated into the interface box.

The mobile motor servicing software application 30 may be stored on and executed by any of the portable electronic devices 24, 26, 28. An embodiment of the mobile motor servicing software application 30 may broadly include the graphical user interface and executable computer code for implementing aspects of the invention. The graphical user interface may include virtual images, text, text input boxes, checkboxes, buttons, and other user-selectable inputs. The graphical user interface may have a layout that mimics the look of motor controls of the motor 12, 14, 16 or of a conventional interface box of a motor and may also include user instructions in the form of text, icons, images, videos, and other visual cues.

The executable computer code may be provided for implementing logical functions in the portable electronic devices 24, 26, 28 and can be embodied in any non-transitory computer-readable medium for use by or in connection with an instruction execution system, apparatus, or device, such as the portable electronic devices 24, 26, 28, a processor-containing system, or other system that can fetch the instructions from the instruction execution system, apparatus, or device, and execute the instructions. In the context of this application, a "non-transitory computer-readable medium" can be any non-transitory memory that can contain, store, or communicate the programs. The non-transitory computer-readable medium can be, for example, but not limited to, an electronic, magnetic, optical, electro-magnetic, infrared, or semi-conductor system, apparatus, or device. More specific, although not inclusive, examples of the non-transitory computer-readable medium would include the following: an electrical connection having one or more wires, a portable computer diskette, a random access memory (RAM), a read-only memory (ROM), an erasable, programmable, read-only memory (EPROM or Flash memory), an optical fiber, and a portable compact disk read-only memory (CDROM). The mobile applications or computer programs may be distributed between portable electronic devices or may be downloaded from a virtual application marketplace such as the App Store and Google Play. The mobile motor servicing software application 30 may be stored on the non-transitory memory of the portable electronic devices 24, 26, 28 or may reside on one of the server 20 and can be accessed over a wireless internet connection.

The communication network 33 may be the Internet or substantially any other suitable communication network such as a local area network, a wide area network, or an intranet. The communication network 33 may include or be in communication with a wireless network capable of supporting wireless communication such as the wireless networks operated by AT&T, Verizon, or Sprint. The communication network 33 may also be combined or implemented with several different networks.

Figure 4:
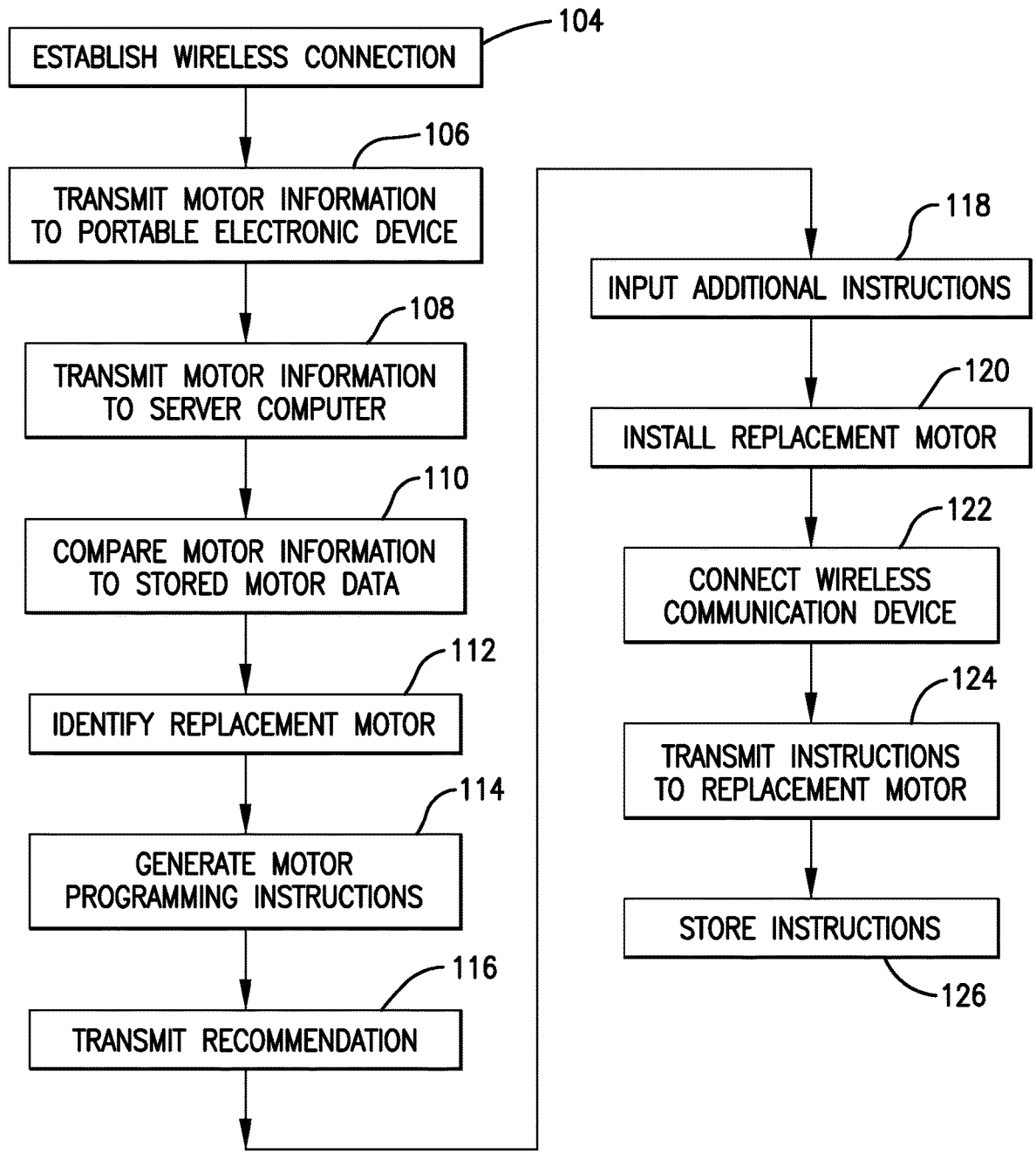
FIG. 4 is a flow diagram depicting steps in an embodiment of a method for identifying and programming a suitable replacement motor for an existing motor without physically connecting to the replacement motor or the existing motor.

Referring to FIG. 4, a method of wirelessly selecting and programming a replacement motor 16 for replacing an existing motor 12 using the system 10 is shown. Some of the blocks of the flow diagram may represent a step or steps in a method or a module segment or portion of code of the mobile applications and computer programs of the present invention. In some alternative implementations, the functions noted in the various blocks may occur in a different order than is depicted in FIG. 4. For example, two blocks shown in succession in FIG. 4 may in fact be executed substantially concurrently, or the blocks may sometimes be executed in reverse order depending upon the functionality involved.

A service technician may establish a wireless connection between the portable electronic device 24 and the wireless communication device 32 incorporated into the existing motor assembly to be replaced, as shown in block 104. The mobile motor servicing software application 30 on the portable electronic device 24 may display an indication that a wireless connection has been made and may display a current status of the existing motor 12 such as "operational" or "standby." The wireless communication device 32 may wirelessly transmit identification, set-up, and/or programming information for the existing motor 12 such as a model number, horsepower (HP) rating, input voltage, manufacturer name, and/or other motor information to the portable electronic device 24 over the Bluetooth or other wireless connection, as shown in block 106. The graphical user interface of the portable electronic device 24 may display the information. The portable electronic device 24 may wirelessly transmit the motor information to the server 20, as shown in block 108. The motor information may be transmitted automatically or after the technician initiates the motor information transmission.

The server 20 may receive the motor information and compare the motor information to motor operating parameters and motor data of a number of motors stored on its memory to identify the existing motor 12, as shown in block 110. For example, the server 20 may use a manufacturer name and a HP rating of the existing motor 12 to determine a model number of the existing motor 12. The server 20 may identify the replacement motor 16 from the available replacement motors that most closely or most effectively can emulate or improve upon the operation of existing motor 12, and generate a motor recommendation representative of the replacement motor, as shown in block 112. For example, the server 20 may identify the replacement motor 16 that has the same input voltage as the existing motor 12 and that has the smallest HP range that includes the HP rating of the existing motor 12. The replacement motor recommendation may be a model number, a brand name, a motor operating parameter, or any other information that identifies a suitable replacement motor and may include installation instructions for aiding the technician in installing the replacement motor.

The server 20 may also generate motor programming instructions based on the motor information, as shown in block 114. Alternatively, the server 20 may retrieve motor programming instructions that have been designated for emulating the existing motor 12. The motor programming instructions may be machine-readable computer data or may be in human readable form. The server 20 may wirelessly transmit the replacement motor recommendation and the motor programming instructions to the portable electronic device 24, as shown in block 116.

The technician may input additional motor programming instructions into the mobile motor servicing software application 30 via the graphical user interface 40, as shown in block 118. The additional motor programming instructions may be used for overriding and/or supplementing parts of the motor programming instructions transmitted from the server 20. The technician may use the replacement motor recommendation to select the replacement motor 16, and install the replacement motor 16 in place of the existing motor 12, as shown in block 120. The graphical user interface of the mobile motor servicing software application 30 may display installation instructions transmitted with the replacement motor recommendation to aid the technician in installing the replacement motor 16. The technician may use the portable electronic device 24 to wirelessly transmit the motor programming instructions to the wireless communication device 32 incorporated into, onto, adjacent to, or otherwise similarly associated with the replacement motor 16, which passes the motor programming instructions to the microprocessor 22 of the controller 18 of the replacement motor 16, as shown in block 124.

The motor programming instructions may then be stored on the memory of the replacement motor's controller 18, as shown in block 126. The replacement motor's controller 18 may reference the motor programming instructions and instruct the replacement motor 16 to operate in the same way as the existing motor 12. For example, the controller 18 may instruct the replacement motor 16 to operate at the same operating speed and torque as the existing motor 12.

The above-described systems and methods for wirelessly programming a replacement motor for replacing an existing motor provide several advantages over conventional systems for selecting and programming replacement motors. For example, a technician can stock a few motors suitable for use in many applications and does not need to transport or have access to large inventories of motors for selecting a suitable replacement motor. The technician can use their own or a readily available portable electronic device to program the motor and does not need to take the motor to a location with a specialized motor programming computer. Further, the technician does not need to have and carry programing tools, such as wireless communication devices and connectors for physically connecting to the existing and/or replacement motor. Further, the incorporated wireless communication devices facilitate interfacing with motor sensors whenever desired.

An aftermarket dealer or an original equipment manufacturer (OEM) can also more conveniently program the replacement motor 16 at the point of purchase or at the point of assembly without sending the motor back to the manufacturing facility. Also, the aftermarket dealer or OEM can stock a few multi-purpose motors instead of stocking large inventories of limited purpose motors.

Figure 5:
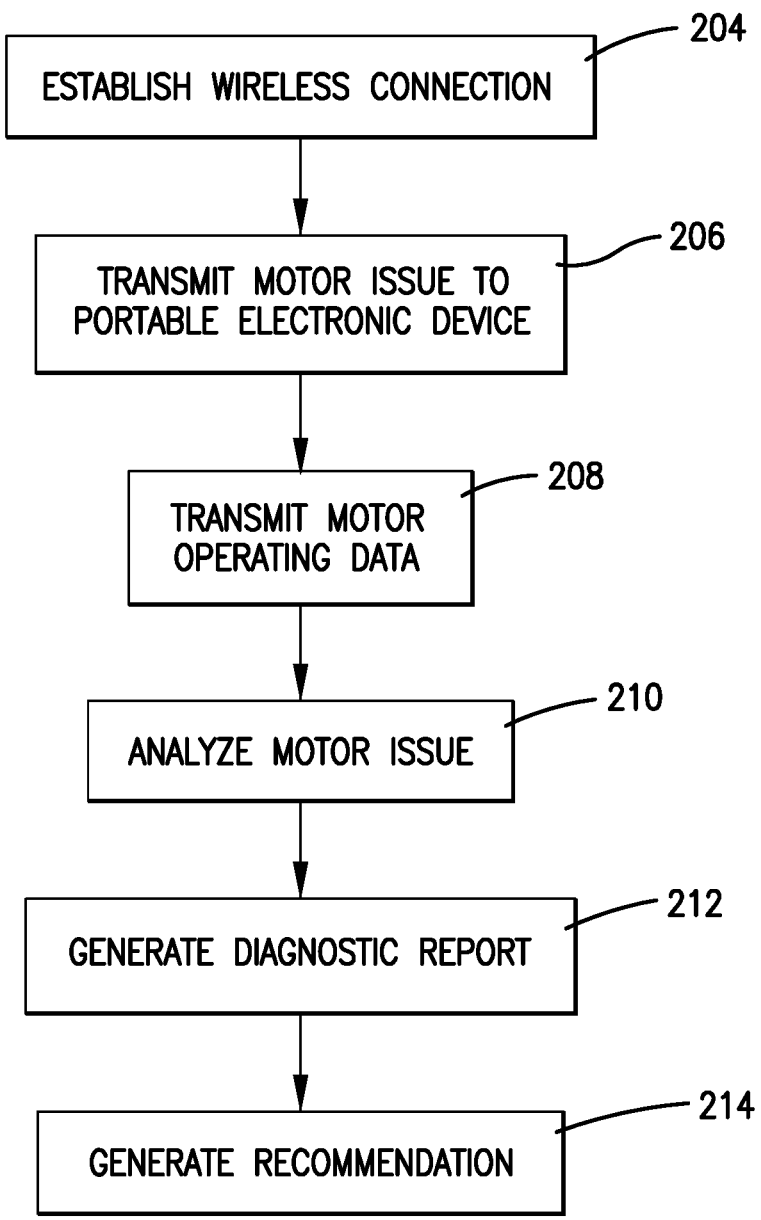
FIG. 5 is a flow diagram depicting steps in an embodiment of a method for monitoring and/or diagnosing a motor without physically connecting to the motor.

Referring to FIG. 5, a method of wirelessly monitoring, diagnosing, or otherwise determining a performance of a motor a motor 12 using the system 10, particularly the mobile motor servicing software application 30 on the portable electronic device 24, is shown. Some of the blocks of the flow diagram may represent a step or steps in a method or a module segment or portion of code of the mobile applications and computer programs of the present invention. In some alternative implementations, the functions noted in the various blocks may occur out of the order depicted in FIG. 5. For example, two blocks shown in succession in FIG. 5 may in fact be executed substantially concurrently, or the blocks may sometimes be executed in the reverse order depending upon the functionality involved.

A service technician may establish a wireless connection between the portable electronic device 24 and the wireless communication device 32, as shown in block 204. The mobile motor servicing software application 30 on the portable electronic device 24 may display an indication that a wireless connection has been made. The wireless communication device 32 may transmit identification, set-up, and/or programming information about the motor 12 such as a model number, HP rating, input voltage, manufacturer name, and other motor information to the portable electronic device 24 via the Bluetooth or other wireless connection. The graphical user interface of the mobile motor servicing software application 30 may display the motor information on the display screen of the portable electronic device 24.

The wireless communication device 32 may transmit a wireless signal representative of a motor controller error, a mechanical failure, an electrical failure, or other issue to the portable electronic device 24 over the Bluetooth or other wireless connection, as shown in block 206. The information in the wireless signal may be a nonhuman-readable diagnostic code or a proprietary code indicative of the motor issue. The wireless communication device 32 may also transmit motor operating history data stored on the memory of the motor controller 18 to the portable electronic device 24, as shown in block 208. The motor operating history data may contain useful diagnostic information about the performance of the motor 12 such as operating hours, peak voltages, and operating temperatures.

The mobile motor servicing software application 30 may interpret and analyze or transmit to the server computer 20,22 for interpretation and analysis the information representative of the motor issue and/or the motor operating data to diagnose the motor issue, as shown in block 210. For example, the mobile motor servicing software application 30 or the server computer 20,22 may interpret a code in the wireless signal to represent an electrical short or an imbalanced motor. The mobile motor servicing software application 30 or the server computer 20,22 may compare recorded voltage data to determine that the motor 12 is frequently receiving overvoltages. The mobile motor servicing software application 30 or the server computer 20,22 may generate an error message or a diagnostic report based on the above analysis and display or transmit for display the error message or diagnostic report via the graphical user interface 40, as shown in block 212. For example, the error message may indicate that the motor issue could not be determined. The diagnostic report may indicate that the motor 12 is in danger of overheating or that the wiring insulation of the motor 12 may be at the end of its expected life cycle.

The mobile motor servicing software application 30 or the server computer 20,22 may generate or retrieve from memory a recommendation for fixing or replacing the motor 12 based on the above analysis, as shown in block 214. The graphical user interface of the mobile motor servicing software application 30 may display the recommendation on the display screen of the portable electronic device 24. Alternatively, the mobile motor servicing software application 30 may retrieve a recommendation for fixing or replacing the motor 12 from memory or the memory of the server computer 20,22 that has been determined to be the best solution for fixing or replacing the motor 12.

The above-described systems and methods for wirelessly servicing motors via a portable electronic device 24 provide several advantages over conventional systems for servicing motors. For example, a technician can diagnose a motor without carrying different types of motor diagnostic tools and adaptors or wireless communication devices and connectors for physically connecting to the motor. Further, the incorporated wireless communication devices facilitate interfacing with motor sensors whenever desired.

A person such as a homeowner can also use the systems and methods of the present invention to diagnose the motor without requesting the assistance of a technician. This allows the homeowner to immediately address critical HVAC or pump issues such as when a heater motor malfunctions during the winter.

Figure 6:
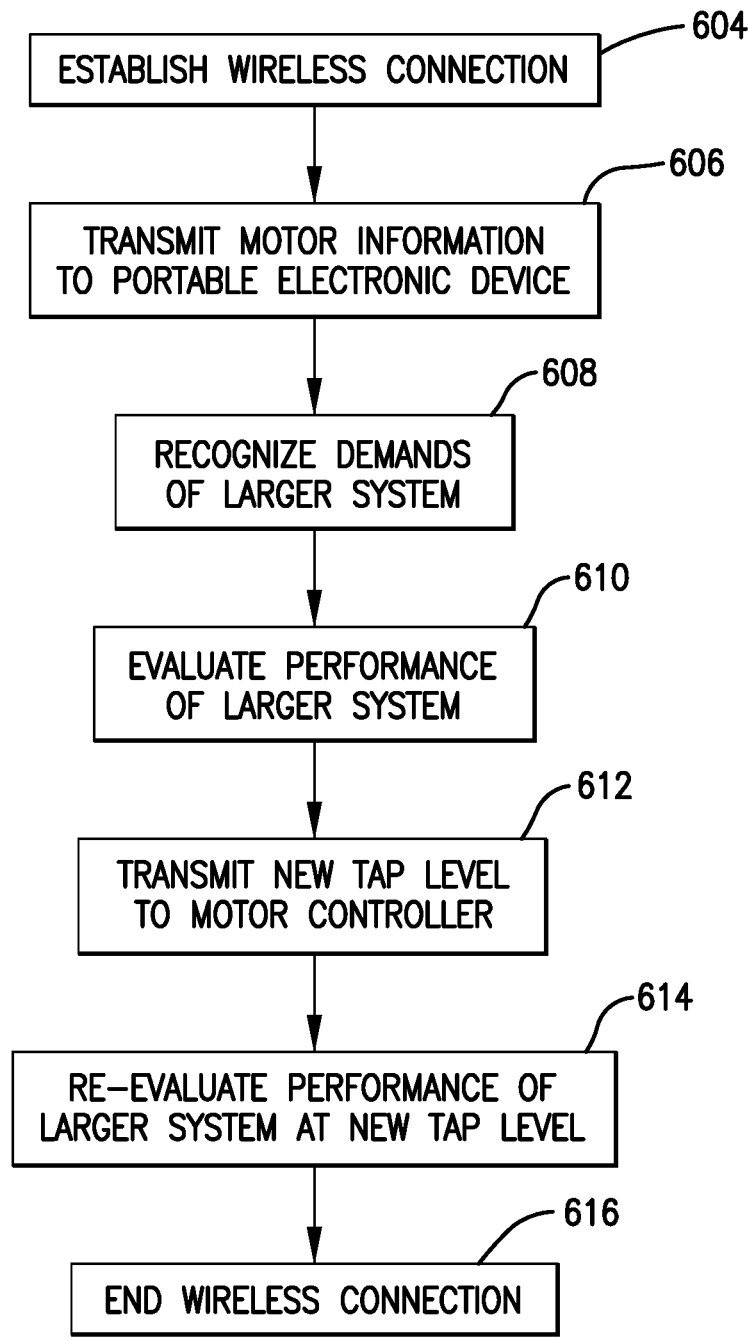
FIG. 6 is a flow diagram depicting steps in an embodiment of a method for tuning or otherwise reprogramming a motor without physically connecting to the motor.

Referring to FIG. 6, a method of wirelessly tuning or otherwise reprogramming a motor 12 using the system 10, particularly the mobile motor servicing software application 30 on the portable electronic device 24, is shown. Some of the blocks of the flow diagram may represent a step or steps in a method or a module segment or portion of code of the mobile applications and computer programs of the present invention. In some alternative implementations, the functions noted in the various blocks may occur out of the order depicted in FIG. 6. For example, two blocks shown in succession in FIG. 6 may in fact be executed substantially concurrently, or the blocks may sometimes be executed in the reverse order depending upon the functionality involved.

For example, it will be understood that a normal control signal may be one of five Tap selections that typically are programmed at the factory. For example, Tap 1 through Tap 5 may respectively provide sixty, seventy, eighty, ninety, and one hundred percent (60%, 70%, 80%0, 90%, and 100%) motor torque depending on the requirements of the larger system of which the motor is a part. At various locations outside of the factory it may be desirable to reprogram one or more of the Tap selections for the purposes of tuning the motor to the larger system under repair. The motor controller microprocessor 22 may be capable of either independently or simultaneously detecting the larger system's twenty-four (24) VAC signal for the run mode or detecting the wireless communication device 34 for tuning the Taps. The motor controller microprocessor 22 may be capable of switching between the two demand sources, one demand source consists of the portable electronic device 24 through the wireless communication device 34, and the other demand source may be the larger system through the T1, T2, T3, T4, T5 tap inputs. Once the wireless communication device 24 is active, the motor's Taps can be changed based on previous history or based on measured parameters, such as data from one or more sensors (e.g., temperature or air flow sensors), or based on stored information in the system's controller or performance manual. This dual mode of operation and recognition by the motor controller microprocessor 22 is not limited to a motor with Tap selection.

Figure 8:
FIG. 8 is a table setting forth Tap settings for a Combination Tuning technique which is relevant to the method of FIG. 6.
Figure 9:
FIG. 9 is a table setting forth Tap settings for an additional tuning technique, which is relevant to the method of FIG. 6.

There may be multiple methods for tuning the existing motor to new performance, and FIG. 7 concerns a process of "Band Tuning" and FIG. 8 concerns a process of "Combination Tuning." Band Tuning involves selecting a desired increase or decrease in torque and moving all factory or previously set torques by a desired percentage of the current setting. The table 300 of FIG. 7 shows four possible final Taps setting of +/−five percent (5%) and +/−ten percent (10%). Combination Tuning allows for the tuning of Taps by selecting them in groups of two or more, wherein the group levels may be user selected from the portable electronic device. The table 400 of FIG. 8 shows several combination tunings of new Tap levels. FIG. 9 concerns an additional tuning feature which allows for selecting defined off delays to meet the larger system's requirements, whether that system is an HVAC unit in Heat or Cool mode or a fluid pump. The table 500 of FIG. 8 relates Tap selections to off delays. Tuning may also be achieved based on the larger system's power levels for any or all of the Tap inputs. The power levels might come from the larger system's stored information on the server 20 or from the motor 12 being replaced. The wireless communication device 34 in conjunction with running in the Tap mode allows for data from the larger system and motor performance history to be stored in the portable electronic device 24 and/or the server 20.

Referring again to FIG. 6, a service technician may establish a wireless connection between the portable electronic device 24 and the wireless communication device 32, as shown in block 604. The mobile motor servicing software application 30 on the portable electronic device 24 may display an indication that a wireless connection has been made. The wireless communication device 32 may transmit identification, programming, and/or operating information about the motor 12 such as a model number, HP rating, input voltage, manufacturer name, and other motor information to the portable electronic device 24 via the Bluetooth or other wireless connection, as shown in block 606, and the graphical user interface of the mobile motor servicing software application 30 may display the motor information on the display screen of the portable electronic device 24. Further, the larger system's demands may be recognized from signal inputs, as shown in block 608.

The mobile motor servicing software application 30 may evaluate the performance of the larger system, or may transmit the motor information to the server computer 20 to evaluate the performance of the larger system, and generate or receive from the server computer 20 motor tuning or other programming instructions, as shown in block 610. The mobile motor servicing software application 30 may transmit the tuning or other programming instruction (e.g., a new Tap level) to the motor controller 18, and the new programming instructions may be stored on and executed by the motor controller's microprocessor 22, as shown in block 612. The mobile motor servicing software application 30 may then re-evaluate the performance of the larger system to confirm improvement due to the new programming instructions, as shown in block 614. The technician may end the wireless connection, and the motor may continue to run with the new programming instructions, as shown in 616.

The above-described systems and methods for wirelessly tuning or otherwise reprogramming motors provide several advantages over conventional systems for reprogramming motors. For example, a technician can use their own or a readily available portable electronic device to reprogram the motor and does not need to take the motor to a location with a specialized motor reprogramming computer. Further, the technician does not need to have and carry programing tools, such as connectors for physically connecting to the motor. Further, the incorporated wireless communication devices facilitate interfacing with motor sensors whenever desired.

Although the invention has been described with reference to the one or more embodiments illustrated in the figures, it is understood that equivalents may be employed and substitutions made herein without departing from the scope of the invention as recited in the potential claims set forth below.

The invention claimed is:

1. A system for selecting and programming a replacement motor for an existing motor, the system comprising:
 a server computer including—
  a non-transitory computer readable medium storing—
   selection information for selecting the replacement motor, and
   programming information for programming the replacement motor, and
  a connection to a wireless communication network; and
 a portable electronic communications device configured to wirelessly communicate with the existing and replacement motor controllers via a first wireless transceiver physically incorporated into the existing motor controller and a second wireless transceiver physically incorporated into the replacement motor controller such that no physical connections are required between the portable electronic communications device and the existing or replacement motor controllers, and to wirelessly communicate with the server computer via the connection to the wireless communication network, and
 the portable electronic communications device including a software application configured to—
  wirelessly receive identification information for the existing motor from the existing motor controller,
  wirelessly transmit the identification information to the server computer, wherein the server computer determines a recommendation for the replacement motor and the programming information for the replacement motor based on the identification information,
  wirelessly receive the recommendation for the replacement motor and the programming information for the replacement motor, and
  wirelessly transmit the programming information to the replacement motor controller of the replacement motor.

2. The system of claim 1, wherein the portable electronic communications device is a smartphone.

3. The system of claim 1, wherein the portable communications device is configured to communicate with the first and second wireless transceivers via Bluetooth, and the wireless communication network over which the portable electronic communications device communicates with the server computer is the Internet.

4. The system of claim 1, wherein the identification information includes at least one of a model number, a horsepower rating, an input voltage, and a manufacturer name for the existing motor.

5. The system of claim 1, wherein the portable electronic communications device visually displays the identification information.

6. The system of claim 1, wherein the recommendation for the replacement motor is in the form of at least one of a model number, a brand name, and a motor operating parameter.

7. The system of claim 1, wherein the server computer further wirelessly transmits installation instructions for installing the replacement motor to the portable electronic communications device, and the portable electronic communications device wirelessly receives and visually displays the installation instructions.

8. A system for managing a performance of a motor, the system comprising:
a server computer including—
a non-transitory computer readable medium storing—
diagnostic information for diagnosing a performance problem of the motor, and
recommendation information for recommending an action for addressing the performance problem of the motor, and
a connection to a wireless communication network; and
a portable electronic communications device configured to wirelessly communicate with the motor controller via a wireless transceiver physically incorporated into the motor controller such that no physical connection is required between the portable electronic communications device and the motor controller, and to wirelessly communicate with the server computer via the connection to the wireless communication network, and
the portable electronic communications device including a software application configured to—
wirelessly receive identification information for the motor from the motor controller,
wirelessly receive operating information for the motor from the motor controller,
wirelessly transmit the identification and operating information to the server computer, wherein the server computer determines whether the motor is performing properly based on the identification and operating information, and if the motor is not performing properly, the server computer identifies a motor issue for the motor based on the diagnostic information and determines a recommendation for a particular action for addressing the motor issue based on the recommendation information, and
wirelessly receive and visually display the recommendation for the particular action for addressing the performance problem.

9. The system of claim 8, wherein the portable electronic communications device is a smartphone.

10. The system of claim 8, wherein the software application is further configured to visually display the identification and operating information.

11. The system of claim 8, wherein the operating information includes a diagnostic indicator of a performance problem.

12. The system of claim 8, wherein the operating information includes an operating history for the motor.

13. The system of claim 12, wherein the operating history includes a number of operating hours, one or more peak voltages, and one or more operating temperatures.

14. The system of claim 8, wherein the particular action for addressing the performance problem is to replace the motor.

15. The system of claim 8, the system further including one or more sensors monitoring a motor condition of the motor, and the software application is further configured to wirelessly receive sensor data from the one or more sensors regarding the condition of the motor, and to wirelessly transmit the sensor data to the server computer along with the identification and operating information.

16. A system for tuning a motor to a larger system in which the motor is incorporated, the system comprising:
a server computer including—
a non-transitory computer readable medium storing—
evaluation information for evaluating a performance of the larger system, and
recommendation information for recommending an action for tuning the motor to the larger system based on the performance of the larger system, and
a connection to a wireless communication network; and
a portable electronic communications device configured to wirelessly communicate with the motor controller via a wireless transceiver physically incorporated into the motor controller such that no physical connection is required between the portable electronic communications device and the motor controller, and to wirelessly communicate with the server computer via the connection to the wireless communication network, and
the portable electronic communications device including a software application configured to—
wirelessly receive an identification information for the motor from the motor controller,
wirelessly receive a programming information for the motor from the motor controller,
wirelessly receive an operating information for the motor from the motor controller,
wirelessly transmit the identification, programming information, and operating information to the server computer, wherein the server computer evaluates the performance of the larger system based on the evaluation information, and if the larger system is not performing at a desired level, the server computer determines a recommendation for a particular action for improving the performance of the larger system based on the recommendation information,
wirelessly receive the recommendation for the particular action, and wirelessly transmit a change to the programming information to the motor controller of the motor in accordance with the particular action, and
repeat the foregoing actions to confirm that the larger system is performing at the desired level.

17. The system of claim 16, wherein the portable electronic communications device is a smartphone.

18. The system of claim 16, wherein the portable electronic communications device visually displays the identification information, the programming information, and the performance information.

19. The system of claim 16, wherein the change to the programming information includes changing a tap setting.

20. The system of claim 16, the system further including one or more sensors monitoring a system condition of the larger system, and the software application of the portable electronic communications device is further configured to wirelessly receive sensor data from the one or more sensors regarding the system condition, and to wirelessly transmit the sensor data to the server computer along with the identification information, the programming information, and the operating information.

* * * * *